United States Patent [19]

Terada

[11] Patent Number: 4,645,563
[45] Date of Patent: Feb. 24, 1987

[54] METHOD OF MANUFACTURING GAAS FIELD EFFECT TRANSISTOR

[75] Inventor: Toshiyuki Terada, Kawasaki, Japan

[73] Assignee: Kabushiki Kaisha Toshiba, Kawasaki, Japan

[21] Appl. No.: 755,799

[22] Filed: Jul. 17, 1985

[30] Foreign Application Priority Data

Sep. 29, 1984 [JP] Japan .................... 59-204416

[51] Int. Cl.$^4$ ............... H01L 21/306; B44C 1/22; C03C 15/00; C23F 1/02
[52] U.S. Cl. .................... 156/643; 29/571; 29/580; 148/187; 156/646; 156/649; 156/653; 156/657; 156/659.1; 156/662; 357/41
[58] Field of Search ............ 29/571, 580; 148/1.5, 148/187; 204/192 E; 156/643, 646, 649, 652, 653, 657, 659.1, 662; 357/23.1, 41

[56] References Cited

U.S. PATENT DOCUMENTS

| | | | |
|---|---|---|---|
| 4,378,627 | 4/1983 | Jambotkar | 156/662 X |
| 4,400,865 | 8/1983 | Goth et al. | 156/643 X |
| 4,455,738 | 6/1984 | Houston et al. | 156/643 X |

FOREIGN PATENT DOCUMENTS 0113161 7/1984 European Pat. Off. .
0113059 7/1984 European Pat. Off. .

OTHER PUBLICATIONS

IEDM Technical Digest, pp. 718-721; S. Ogura et al.; 1982, "A Half Micron MOSFET Using Double Implanted LDD".
The transactions of the Institute of Electronics and Communications Engineers of Japan, National Meeting of Semiconductor/Material Department, p. 116, "Heat-Resistant Gate N+ Self-Aligned Structured GaAs MESFET", Kozuka et al; Sep. 1983.
IEEE Journal of Solid-State Circuits, vol. SC-17, No. 2; P. J. Tsang et al; Apr., 1982, "Fabrication of High-Performance LDDFET's with Oxide Side-Wall-Spacer Technology", pp. 220-226.
IEEE Electron Device Letters, vol. EDL-5, No. 5, May 1984, pp. 159-161, New York, U.S.; J. Nulmann, et al.: "'2-GHz 150-piW Self-Aligned Si MESFET Logic, Section III; FIG. 2.

Primary Examiner—William A. Powell
Attorney, Agent, or Firm—Oblon, Fisher, Spivak, McClelland & Maier

[57] ABSTRACT

A method of manufacturing of a GaAs FET wherein a gate structure is first formed on a GaAs substrate. The gate structure consists of a conductive gate layer and an insulative layer, which are in lateral contact with each other on the substrate. Each layer is isotropically deposited by a CVD process and later anisotropically etched using a RIE process, whereby it has a specific width of the submicron order reduced to an extent substantially equal to an initially deposited thickness thereof. The high frequency property of the GaAs FET can be improved due to the decrease in width of the gate layer. Ion implantation is performed with the gate structure used as a mask to provide in the substrate source and drain regions which are self-aligned with the gate structure. The drain regions are removed from the gate layer at a distance equal to the width of the insulative layer.

9 Claims, 16 Drawing Figures

METHOD OF MANUFACTURING GAAS FIELD EFFECT TRANSISTOR

BACKGROUND OF THE INVENTION

This invention relates to a field effect transistor and more particularly to a manufacturing method of a field effect transistor device whose substrate is prepared from gallium arsenide (GaAs) semiconductor material.

Field effect transistors prepared from gallium arsenide are widely accepted as semiconductor elements constituting important circuit elements involved in high frequency amplifiers and oscillators. Recently, IC devices comprised of GaAs FETs have assumed greater importance due to their various merits.

The high frequency index Pf of a GaAs FET is expressed as $$Pf \propto Cgs/gm$$

where,
 Cgs: stray capacitance between the gate and source of the GaAs FET
 gm: transconductance of the FET It is seen from the above formula that the object of improving the high frequency property of the GaAs FET is attained by reducing the stray capacitance Cgs between the gate and source of the GaAs FET and/or increasing the transconductance of the FET. As is well known, the transconductance gm of the FET is further defined as:

$$gm = gm0/(1 + gm0 \cdot R_s)$$

where,
 gm0: true transconductance primarily defined by the physical property of the channel region of the GaAs FET
 $R_s$: series resistance between the source and gate of the GaAs FET It is seen from the above formula that the improvement of the transconductance of the FET has to be attained by reducing the series resistance $R_s$ between the source and gate of the GaAs FET and/or enlarging the true transconductance gm0 itself. Enlargement of the true transconductance gm0 can be effected by shortening the gate. The foregoing discussion shows that it is necessary for the improvement of the high frequency property of the GaAs FET to reduce the series resistance $R_s$ between the source and gate of the GaAs FET and/or shorten the gate as much as possible.

Further, it is necessary to pay attention to the gate-drain withstand voltage property as an important parameter in studying the performance of the GaAs FET. Now let it be assumed that when a high frequency amplifier is formed of, for example, GaAs FETs, the drain voltage is set at 3 volts, and the pinch-off voltage is set at −2 volts. Then a maximum voltage of 5 volts is impressed on the gate-drain region of one FET gate. Naturally, the breakdown voltage (rating) of the gate-drain region of the GaAs FET should be higher than at least 5 volts. With respect to a high output type high frequency amplifier, it should obviously be taken into account that the gate-drain breakdown voltage of the GaAs FET is demanded to be higher than 10 volts.

Hitherto, difficulties have been encountered in manufacturing a GaAs FET which can be improved to such a level that requirements for the above-mentioned two properties (that is, the high frequency property of the GaAs FET and its high breakdown voltage) can be satisfied at the same time. For instance, it is assumed that the conventional fabrication technique encounters considerable difficulties in trying to shorten the gate length of the GaAs FET to a submicron level in order to realize the improvement of the GaAs FET. Considered in terms of pure technique, it may be possible to shorten the gate length to a submicron level, for example, 0.5 micron. However, the electron irradiation process still has a low wafer-processing capacity. The X-ray lithography is not yet perfected. If, therefore, the manufacturing cost is taken into account, these processes cannot be expected to effect the mass production of satisfactory GaAs FETs. Further, it is well known among those skilled in the art to carry out ion implantation with a metal gate layer on the substrate used as a mask and provide source and drain regions self-aligned with the gate. According to this process, the conductance gm can be increased due to a decrease in the series resistance $R_s$ between the source and gate. This contributes to the improvement of the high frequency properties of FETs. Nevertheless, conventional self-aligned FETs still encounter the difficulties that since the source and drain regions of said FET are simply set adjacent to the metal gate, the distances between the gate and source and also between the gate and drain, are shortened. Consequently, the breakdown voltage property of the gate-drain regions is undesirably deteriorated. In other words, it has hitherto been impossible to simultaneously improve the high frequency and the source-drain breakdown voltage properties of GaAs FETs.

A description may now be made of another approach to the resolution of the aforementioned problems, that is, a "recess structure" type device which is intended to minimize the series resistance $R_s$ between the source region and gate layer. As used herein, the term "recess structure" is defined to mean a specific operational layer whose surface portion positioned under a gate electrode is etched and made thinner. However, the recess structure is still accompanied with the drawbacks that the fabrication of part of the aforementioned operational layer into a specific shape is difficult for the present day etching technique, and it is impossible to provide a recess structure bearing a satisfactory shape which allows for high shape controllability and high reproducibility.

SUMMARY OF THE INVENTION

It is therefore an object of the present invention to provide a new and improved method of manufacturing a high quality GaAs FETs in which the high frequency and gate-drain withstand voltage properties excel.

It is a further object of the invention to provide a new and improved method of efficiently and consistently manufacturing a high quality GaAs FET with excellent high frequency and gate-drain withstand voltage properties by applying a modern machining technique.

According to the GaAs FET manufacturing method embodying this invention, a gate structure is formed on a GaAs substrate in which an operational layer is provided. This gate structure comprises first and second layers which are in lateral contact with each other. The first layer is a conductive layer serving as a gate layer of the transistor. The second layer is an insulative layer. The first and second layers are respectively isotropically deposited and anisotropically etched. Consequently the first and second layers are formed with a width reduced to such an extent as is substantially equal to the thickness when initially deposited.

Thereafter, ion implantation is undertaken with the above gate structure applied as a mask, thereby providing source and drain regions in the substrate. The source and drain regions are self-aligned with the gate structure. The source region is set adjacent to the gate layer. The drain region is set apart from the gate layer at a distance equal to the width of the insulative layer. A GaAs FET manufactured by the above-mentioned process offers the advantages that the gate width can be reduced to a submicron extent easily (without applying any special fabricating technique) and the gate layer, that is, the first layer is removed from the drain region to an extent equal to the width of the insulative layer, that is, the second layer, thereby improving the gate-drain breakdown voltage property of the GaAs FET.

BRIEF DESCRIPTION OF THE DRAWINGS

The present invention is best understood by reference to the accompanying drawings, in which.

DETAILED DESCRIPTION OF THE PREFERRED EMBODIMENTS

Figure 1A:
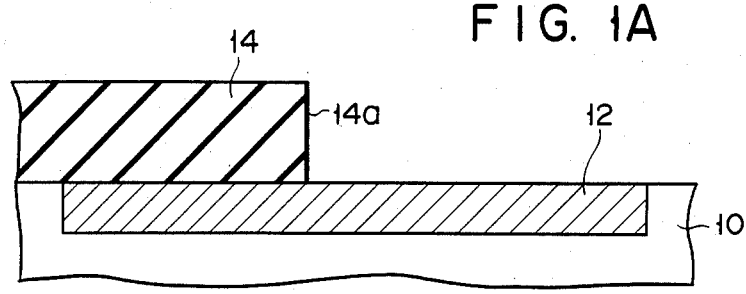
FIGS. 1A to 1H are the enlarged views of a GaAs field effect transistor (GaAs FET) according to a first embodiment of this invention, showing the main sequential steps of manufacturing said embodiments.

Description may now be made with reference to FIGS. 1A to 1H of the method of manufacturing a GaAs FET according to a first embodiment of this invention. Referring to FIG. 1A, reference numeral 10 denotes a semiconductor gallium arsenide (GaAs) substrate doped with chromium (Cr). Si+ ion is implanted into the surface of the substrate 10 by means of selective ion implantation to provide an N conductivity type impurity region 12. The selective implantation of Si+ ion is carried out under the conditions of, for example, 100 KeV and $3.0 \times 10^{12}/cm^2$. The N conductivity type impurity region 12 functions as an operational layer of the FET. An insulative layer 14 prepared from $SiO_2$ is deposited on the substrate 10 by the chemical vapor deposition (CVD) method. The $SiO_2$ layer 14 is defined to have a thickness of about 1 micron. The insulative layer 14 is patterned so as to provide an mask layer whose side edge 14a lies at a specified position on the substrate 10. The side edge 14a covers that portion of the operational layer 12 where a drain region 22 is to be formed, and also defines the drain side edge of a gate metal layer 16 formed by the subsequent step. The $SiO_2$ layer 14 is etched by an anisotropic process, for example, by means of reactive ion etching (RIE) involving the application of a gaseous mixture of $CF_4$ and $H_2$ or a gas of $CHF_3$. As a result, the side wall 14a of the insulative layer 14 is made substantially perpendicular to the substrate surface as seen from FIG. 1A. The reason is that the application of the RIE process causes the layer 14 to be etched with a strong anisotropic characteristic toward the thickness of the layer 14.

Later, a conductive layer 16 is deposited with a uniform thickness over the underlying layer expanse shown in FIG. 1A. This conductive layer 16 is prepared from tungsten silicide ($WSi_2$). This $WSi_2$ layer 16 was formed with a thickness of about 5000 Å by the CVD process involving the application of a gaseous mixture of $WF_6$ and $SiH_4$. This metal conductive layer 16 uniformly covers the substrate 10 and the insulative layer 14 formed on the substrate 10 with the aforementioned edge 14a. Consequently, the metal conductive layer 16 has an outline truthfully representing the stepped portion of the perpendicular edge 14a. It should be noted that the metal 16 is anisotropically grown in directions parallel with the surface of the substrate 10 as well as perpendicular to said surface. The reason is that the CVD process has an excellent property of securing covering of even a stepped portion. Therefore, the horizontal length l1D of the stepped portion of the metal layer 16 which is set adjacent to the side wall 14a of the insulative layer 14 was made substantially equal to the thickness t1 of the insulative layer 14 as shown in FIG. 1B.

Figure 1B:
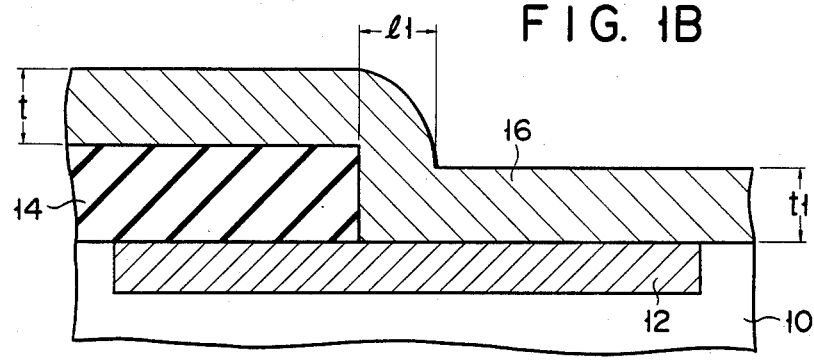
Figure 1C:
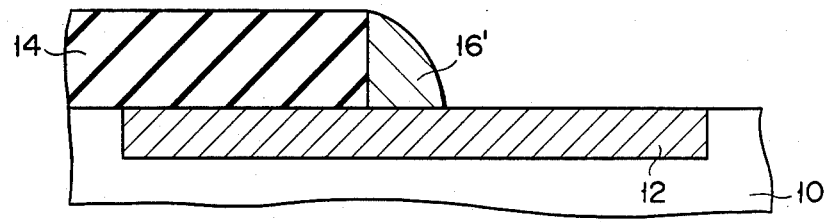

Later, the mass of the superposed layers shown in FIG. 1B is anisotropically etched by the RIE process. In this case, the metal layer 16 is uniformly etched vertically to an extent equal to its thickness t1. In this case, the metal layer 16 is etched along its thickness with a strong anisotropic characteristic. Therefore, the etching does not substantially proceed in the lateral direction. As shown in FIG. 1C, therefore, a metal layer component 16' is retained in such a manner that it lies on part of the substrate surface and is set adjacent to the side wall 14a of the patterned insulative layer 14.

Detailed description will now be made of the aforementioned process. When the deposited metal layer 16 (FIG. 1B) is etched by the RIE process, the etching proceeds only in a direction extending from the upper surface of the metal layer 16 along its thickness, that is, perpendicular direction. When etching proceeds to an extent corresponding to the thickness (t1) of the metal layer 16 in the flat surface of the substrate 10, then the RIE process is completed. Consequently, a metal component 16' set adjacent to the side wall 14a of the insulative layer 14 is retained. This retained metal component 16' functions as the gate electrode of the GaAs FET. It should be noted that the retained metal component 16' has a width of about 0.5 micron substantially equal to the thickness t1 of the layer 14 deposited on the substrate 10. In other words, a gate electrode has been formed with a thickness reduced to an extent of submicrons.

Figure 1D:
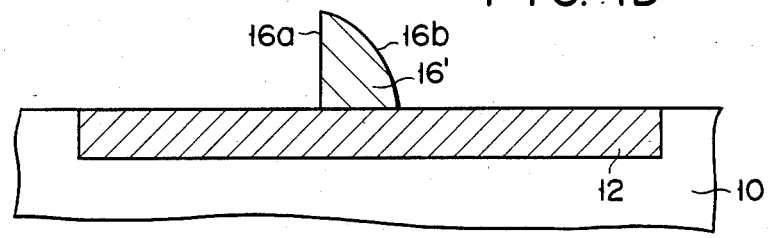

Later, the $SiO_2$ layer 14 is removed by an extent of the hydrofluoric base. Consequently as shown in FIG. 1D, the metal component 16' (gate layer) alone is retained on the substrate 10. This metal component 16' comprises a side wall 16a truthfully representing the perpendicular side wall 14a of the $SiO_2$ layer 14 and a plane 16b inclined rightward to said side wall 16a.

Figure 1E:
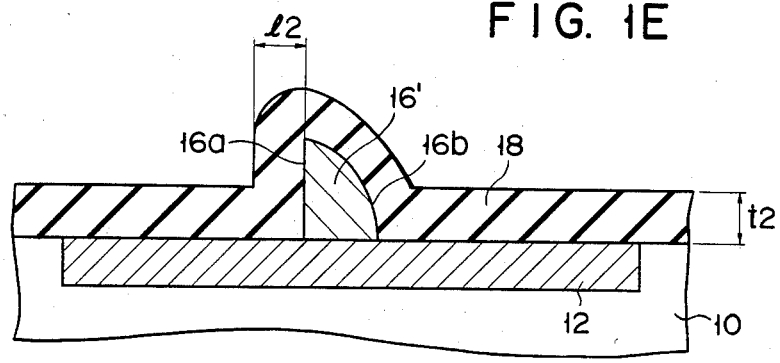

Later as shown in FIG. 1E, and $SiO_2$ layer 18 is deposited on the aforementioned mass of superposed layers by the plasma CVD process involving the application of a gaseous mixture of $SiH_4$ and $N_2O$. The $SiO_2$ layer 18 has its thickness defined to be about 0.3 micron smaller than that of the aforesaid $SiO_2$ layer 14. The plasma CVD process applied in the deposition of the $SiO_2$ layer 18 has as excellent a property of covering a stepped portion as the aforementioned CVD process. Namely, the plasma CVD process can provide a cover truthfully representing the undulating outline of the underlying layer. Therefore, the $SiO_2$ layer 18 deposited by the plasma CVD process is grown isotropically in a direction parallel with the surface of the substrate 10 as well as in a direction perpendicular to said surface. As shown in FIG. 1E, therefore, the lateral length of the SiO$_2$ insulative layer 18 set adjacent to the perpendicular wall of the gate electrode 16' is made substantially equal to the thickness t2 of said SiO$_2$ insulative layer 18.

Figure 1F:
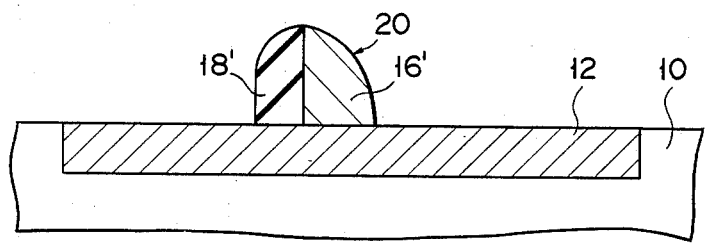

Later, the RIE etching process involving the application of a gaseous mixture of CF$_4$ and H$_2$ is carried out. As a result, the insulative SiO$_2$ layer 18 is vertically etched to a uniform extent equal to the thickness t2 of the insulative layer 16. In this case, too, the etching of the insulative SiO$_2$ layer 18 proceeds with a very strong isotropical property along the thickness of the insulative SiO$_2$ layer 18. As seen from FIG. 1F, therefore, an SiO$_2$ layer component 18' is retained on the substrate 10 so as to be set adjacent to the side wall 16a of the gate electrode layer 16'. It should be noted that in this case, the retained SiO$_2$ layer component 18' has a thickness of about 0.3 micron substantially equal to that t2 of the previously deposited SiO$_2$ layer 18. As shown in FIG. 1F, therefore, a projection 20 is provided on the active layer 12 of the substrate 10 which is constructed by the joint vertical abutment of the gate metal layer 16' and insulative layer 18'. This projecting abutted mass 20 has a width of 0.8 micron, because the gate metal layer 16' has a width of 0.5 micron and the insulative SiO$_2$ layer component 18' has a width of 0.3 micron.

Figure 1G:
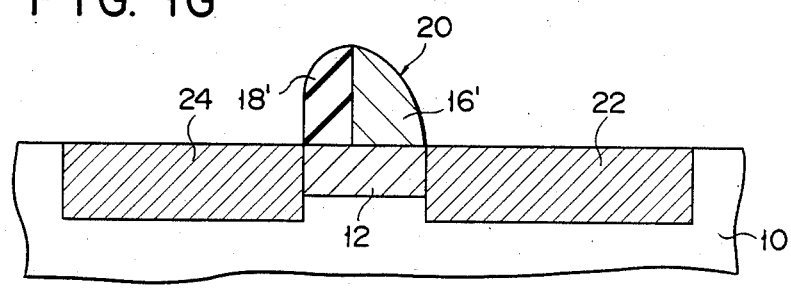
Figure 1H:
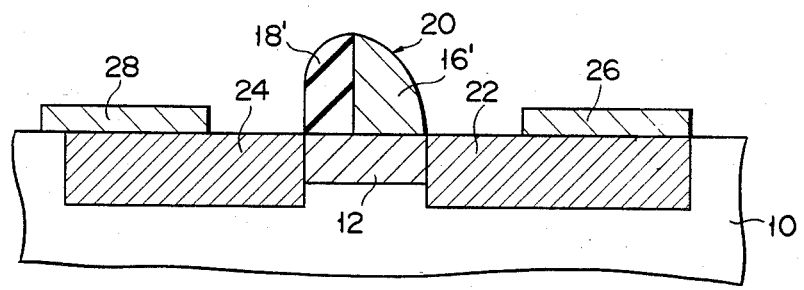

Si$^+$ ion is implanted in the structure of FIG. 1F by masking the areas other than the operational layer 12 (constituting the source and drain regions) of the FET with a photoresist film (not shown). The implantation of the Si$^+$ ion was carried out under the conditions of, for example, 150 KeV and $3.0 \times 10^{13}$/cm$^2$. In the above-mentioned Si$^+$ ion implantation, the projecting abutted mass 20 acts as a mask, thereby preventing ions from being implanted in the layers 12 underlying the projecting abutted mass 20. Consequently, as shown in FIG. 1G, highly concentrated impurity implanted layers (n+ layers) 22, 24 are formed while effecting self-alignment with the projecting abutted mass 20. The n+ layers 22, 24 which are formed with a greater depth than the active layer 12 serve as the source and drain regions of the GaAs FET. As seen from FIG. 1G, the source region 22 is drawn near the gate metal layer 16', whereas the drain layer 24 is removed from the gate layer 16' to an extent equal to the width of the insulative layer 18'. In other words, the gate layer 16' takes an offset position with respect to the drain regions 24.

The wafer of FIG. 1G in which the source and drain regions are formed by ion implantation is subsequently annealed to activate the impurity ions implanted into the substrate 10. According to the present invention, the annealing was applied at a temperature of 850° C. for 10 minutes. After the annealing is ended, highly conductive metal layers 26, 28 are respectively deposited on the source and drain regions 22, 24 to function as source and drain electrodes. These electrodes 26, 28 are prepared from AuGe base alloy, and are set apart from the projection abutted mass 20 consisting of the gate metal layer 16 and insulative layer 18' at a prescribed distance. The GaAs FET is completed through the above-mentioned steps.

With the GaAs FET manufactured by the method of this invention, the gate has a length reduced to the submicron extent (0.5 micron in the example). The source is set adjacent to the gate, thereby prominently minimizing a series resistance R$_s$ between the source and gate regions. Consequently, the transconductance gm of the GaAs FET is increased, to improve the high frequency property of this element. It should be noted that according to this invention, still imperfect manufacturing processes such as electron beam irradiation or X-ray lithography is not applied at all to provide a gate having a length of the submicron order. Namely, this invention can provide a fine gate under well-controlled conditions simply by applying a process widely accepted at present. This fact bears great industrial importance for the GaAs FET manufactures in general, because they can be produced at low cost.

The GaAs FET of this invention is improved not only in its high frequency property, but also in its gate-drain breakdown voltage property. The reason is that the drain layer 24 is removed from the gate layer 16' to an extent equal to the width (0.3 micron) of the insulative layer 18' which is in contact with the gate layer 16' having a width of 0.5 micron. The offset position of the gate element has elevated the gate-drain breakdown voltage property by about 12 volts. This value means that the gate-drain breakdown voltage of the GaAs FET of the present invention has been improved to be about twice that of the conventional device. Namely, the method of this invention enables a GaAs FET device which excels in both its high frequency and gate-drain withstand voltage properties to be effectively manufactured and at less cost within present day fabrication techniques.

Description may now be made with reference to FIGS. 2A to 2H of the method of manufacturing a GaAs FET according to a second embodiment of this invention. The parts of FIGS. 2A to 2H the same as those of the GaAs FET of FIG. 1 are denoted by the same numerals, detailed description thereof being omitted.

Referring to 2A, an N conductivity type impurity region 12 functioning as the operational layer of the GaAs FET is formed on the surface of a GaAs substrate 10 by a selective ion-implantation process. Formed on the GaAs substrate 10 is an amorphous silicon layer 50 (functioning as a spacer film) with a thickness of 0.5 micron. The amorphous silicon layer 50 is patterned by the RIE etching process. As a result, the silicon layer 50 is provided with an edge 50a set perpendicular at a prescribed position on the substrate 10. The silicon layer 50 covers a source region formed in the aforesaid layer 12. The perpendicular edge 50a defines the drain side of a subsequently deposited gate 54.

An SiO$_2$ layer 52 is deposited on the underlying mass of superposed layers with a uniform thickness T1 (ex. 0.3 micron) by the CVD process. The SiO$_2$ layer 52 covers the substrate 10 and the amorphous silicon layer 50 having a perpendicular edge 50a with a uniform thickness. It should be noted that as seen from FIG. 2B, the horizontal length L1 of that portion of the SiO$_2$ layer 52 which is set adjacent to the side wall 50a of the silicon layer 50 is made substantially equal to the thickness T1 of the layer 50. This feature is derived from the excellent stepped portion-covering property of the CVD method as previously described with respect to the first embodiment.

Figure 2A:
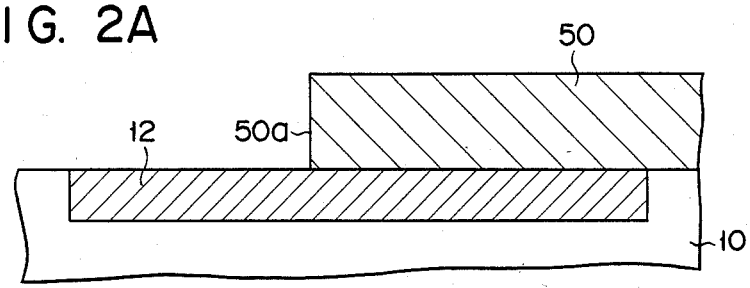
FIGS. 2A to 2H are the enlarged views of a GaAs field effect transistor (GaAs FET) according to a second embodiment of the invention, showing the main sequential steps of manufacturing said embodiment.
Figure 2B:
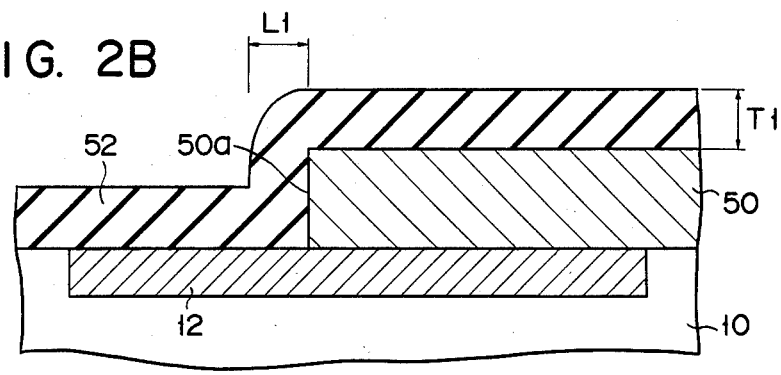
Figure 2C:
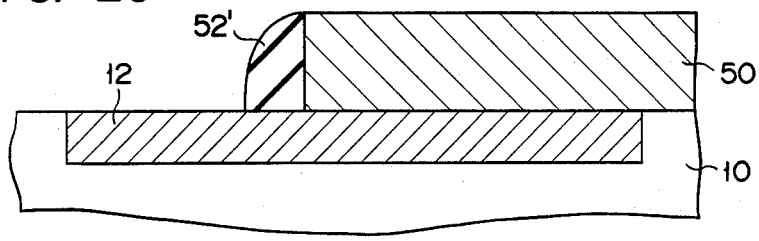

Thereafter, the SiO$_2$ layer 52 is anisotropically etched in the vertical direction by the RIE etching process uniformly to an extent equal to the thickness T1 of the SiO$_2$ layer 52. As shown in FIG. 2C, a SiO$_2$ layer component 52' is retained on the substrate 10 so as to be in lateral contact with the side wall 50a of the patterned silicon layer 50. Like the process shown in FIG. 1C of the aforesaid first embodiment, the etching process applied in the second embodiment is characterized in that when the SiO$_2$ layer 52 is etched by the RIE etching process, the etching proceeds from the upper surface of said layer 52 only along the thickness thereof (that is, in the vertical direction), and the RIE etching process is completed when etching proceeds to an extent equal to the thickness T1 of the layer 52 on the surface of the substrate 10. As a result, an insulator component 52' is retained on the substrate 10 so as to be in contact with the side wall 50a of the silicon layer 50. This retained insulator component 52' has a thickness of about 0.3 micron substantially equal to that T1 of the insulative layer 14 deposited on the substrate 10.

Thereafter, the amorphous silicon layer 50 is removed. As a result, the insulator component 52' alone (FIG. 2D) is retained on the substrate 10. This insulator component 52' comprises a side wall 52a truthfully representing the perpendicular side wall 50a of the silicon layer 50 and an inclined plane 52b provided on the opposite side to said perpendicular side wall 50a.

Figure 2D:
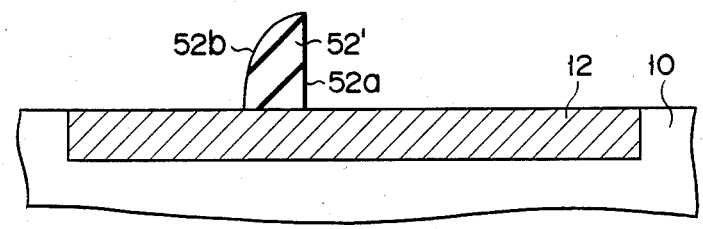
Figure 2E:
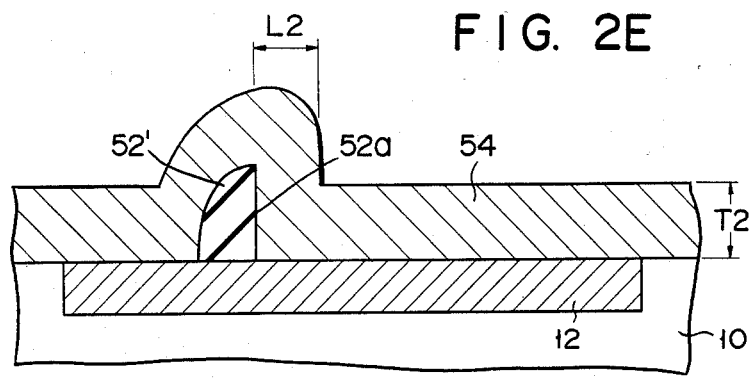

Later as shown in FIG. 2E, a metal layer 54 is uniformly deposited on the underlying structure of superposed layers of FIG. 2D. In the second embodiment, the gate metal is prepared from tungsten silicide WSi$_2$. The metal layer 54 is defined to have a thickness T2 of, for example, 0.5 micron. The CVD method having an excellent stepped portion-covering property enables the metal layer 54 to be isotropically grown in a direction parallel with the surface of the substrate 10 and also in a direction perpendicular to the substrate surface. As shown in FIG. 2E, therefore, that portion of the metal layer 54 which is set adjacent to the perpendicular side wall 52a of the retained insulator component 52' has a length L2 substantially equal to the thickness T2 of the metal layer 54.

Figure 2F:
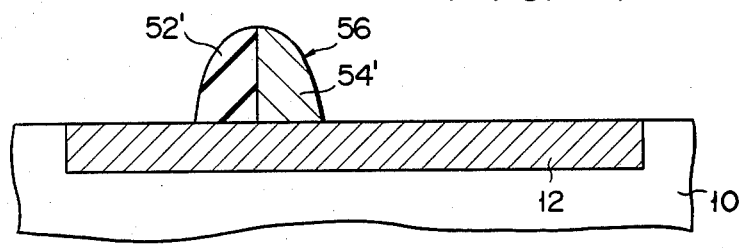
Figure 2G:
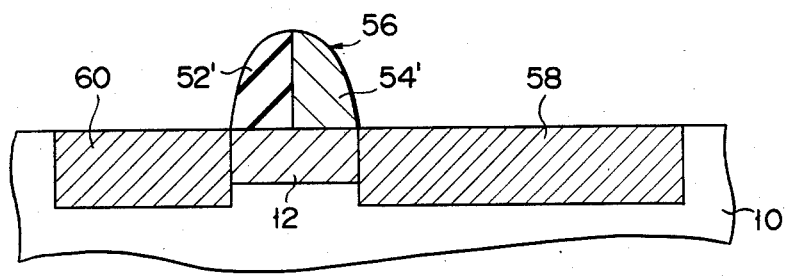

Therefore, the metal 54 is uniformly etched in a vertical direction by the RIE process to an extent equal to its thickness T2. After the etching is ended, a metal layer component 54' is retained on the substrate 10 so as to be set adjacent to the side wall of the aforesaid insulative layer 52 (FIG. 2F). As a result, a projecting abutted mass 56 consisting of the layer components 52', 54'. The layer component 54' serves as the gate electrode of the GaAs FET, and has a width of about 0.5 micron substantially equal to that T2 of the deposited metal layer 54.

Figure 2H:
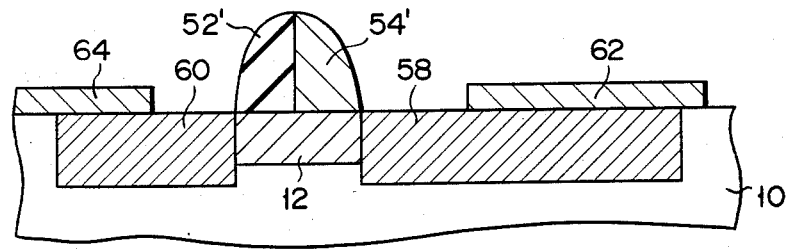

The subsequent manufacturing process of the second embodiment of this invention involves substantially the same steps as those of the first embodiment. Source and drain regions 58, 60 are formed by ion implantation so as to be self-aligned with a projecting abutted layer 56 consisting of a gate layer 54' and insulator 52', and later are annealed (FIG. 2G), thereby providing source and drain electrodes 62, 64 (FIG. 2H). As seen from FIG. 2H, the gate layer 54' is removed from the drain layer 60 at a distance equal to the width of the insulator 52'.

The manufacturing method of the second embodiment of this invention enables a GaAs FET with excellent high frequency and gate-drain breakdown voltage properties to be manufactured effectively and at low cost within the range of present day fabrication techniques.

Although the present invention has been shown and described with reference to particular embodiments, various changes and modifications which are obvious to a person skilled in the art to which the invention pertains are deemed to lie within the scope of the invention. For instance, the materials, the conditions for defining the parameters of the CVD and RIE processes and the annealing conditions are not limited to those already described, but may be varied as the need arises. In FIG. 2A, the spacer film 50, which is deposited on the substrate 10 to define the perpendicular side wall 50a of the insulator component 52', is made of amorphous silicon. However, other materials may be used for the spacer film 50, if they can be effectively etched off without damaging the insulator component 52'.

What is claimed is:

1. A method for manufacturing a GaAs field effect transistor, comprising the steps of:

forming, on a gallium arsenide substrate involving an operational layer, a gate structure comprising a first layer which is conductive to serve as a gate layer of said transistor and a second layer which is insulative, each of said first and second layers being isotropically deposited and anisotropically etched and made to have a width substantially equal to an initial thickness with which it was initially deposited; and performing ion implantation with said gate structure used as a mask to provide in said substrate source and drain regions which are self-aligned with said gate structure, said source region being set adjacent to said gate layer, and said drain region being removed from the gate layer at a distance equal to the width of the insulative layer.

2. The method according to claim 1, wherein said step of forming said first layer comprises:

forming an insulation layer on said substrate with the side wall substantially set upright;

uniformly depositing a conductive layer on said substrate and said insulation layer by a process so selected as to cause the deposition to proceed isotropically;

anisotropically etching said conductive layer, thereby providing a conductive layer component which is in lateral contact with the vertical side wall of said insulation layer; and removing said insulation layer having said vertical side wall, thereby causing a conductive layer component having a substantially vertical side wall to be retained on said substrate.

3. The method according to claim 2, wherein said step of forming said second layer comprises:

uniformly depositing an insulative layer on said substrate and conductive layer component by processes selected so as to cause the deposition to proceed isotropically etching said insulative layer, thereby providing an insulative layer component set adjacent to the substantially vertical side wall of said conductive layer component; and anisotropically etching said insulative layer, thereby providing an insulative layer component which is in lateral contact with the vertical side wall of said conductive layer component.

4. The method according to claim 2, wherein said conductive layer is isotropically formed by a chemical vapor deposition technique, and is later subjected to reactive ion etching, thereby causing said conductive layer component to have a thickness substantially equal to that of the deposited conductive layer.

5. The method according to claim 4, wherein said insulative layer is isotropically formed by the chemical vapor deposition technique and later processed by reactive ion etching, thereby causing said insulative layer component to have a width substantially equal to that of the deposited insulative layer.

6. The method according to claim 1, wherein said step of forming said second layer comprises:
    forming a third layer having a substantially vertical side wall on said substrate;
    uniformly depositing an insulative layer on said substrate and said third layer by a process selected so as to cause the deposition to proceed isotropically;
    anisotropically etching said insulative layer, thereby providing an insulative layer component set adjacent to the side wall of said third layer; and
    removing said third layer, thereby retaining an insulative layer component having a substantially vertical side wall on said substrate.

7. The method according to claim 6, wherein said step of forming said first layer comprises:
    uniformly depositing a conductive layer on said substrate and insulative layer component by a process selected so as to cause the deposition to proceed isotropically; and
    anisotropically etching said conductive layer, thereby providing a conductive layer component which is in lateral contact with the side wall of said insulative layer component.

8. The method according to claim 7, wherein said insulative layer is isotropically formed by a chemical deposition technique and later subjected to reactive ion etching, thereby causing said insulative layer component to have a thickness substantially equal to that of the deposited insulative layer.

9. The method according to claim 8, wherein said conductive layer is isotropically formed by the chemical vapor deposition technique, and later subjected to reactive ion etching, thereby causing said conductive layer component to have a width substantially equal to that of said deposited conductive layer.

* * * * *